(12) United States Patent
Wang

(10) Patent No.: US 12,379,394 B2
(45) Date of Patent: Aug. 5, 2025

(54) TEST CONNECTOR DEVICE AND MANUFACTURING METHOD OF TERMINAL BLOCK THEREOF

(71) Applicants: SUYIN OPTRONICS CORP., New Taipei (TW); Cheng-Yang Li, New Taipei (TW); Chih-Yuan Wang, New Taipei (TW); Jih-Szu Wang, Keelung (TW)

(72) Inventor: Jih-szu Wang, New Taipei (TW)

( * ) Notice: Subject to any disclaimer, the term of this patent is extended or adjusted under 35 U.S.C. 154(b) by 422 days.

(21) Appl. No.: 17/979,039

(22) Filed: Nov. 2, 2022

(65) Prior Publication Data

US 2023/0138545 A1     May 4, 2023

(30) Foreign Application Priority Data

Nov. 2, 2021 (TW) .................................. 110140851

(51) Int. Cl.
| | |
|---|---|
| G01R 1/04 | (2006.01) |
| G01R 1/073 | (2006.01) |
| G01R 31/26 | (2020.01) |
| H01R 9/24 | (2006.01) |
| H01R 12/71 | (2011.01) |

(52) U.S. Cl.
CPC ......... *G01R 1/0466* (2013.01); *G01R 1/0416* (2013.01); *G01R 1/07307* (2013.01); *G01R 31/26* (2013.01); *H01R 9/24* (2013.01); *H01R 12/714* (2013.01); *H01R 2201/20* (2013.01)

(58) Field of Classification Search
CPC ................ G01R 1/0466; G01R 1/0416; G01R 1/07307; G01R 31/26; G01R 1/07357; G01R 1/07371; G01R 1/07378; H01R 9/24; H01R 2201/20; H01R 12/714; H01R 12/73
USPC ...................................................... 324/756.01
See application file for complete search history.

(56) References Cited

U.S. PATENT DOCUMENTS

| | | | |
|---|---|---|---|
| 5,975,915 A | 11/1999 | Yamazaki | |
| 6,280,219 B1 | 8/2001 | Sano | |
| 6,540,558 B1 | 4/2003 | Paagman | |
| 10,651,596 B1 | 5/2020 | Liu et al. | |

(Continued)

FOREIGN PATENT DOCUMENTS

| | | |
|---|---|---|
| TW | M286496 U | 1/2006 |
| TW | 201633636 A | 9/2016 |
| TW | 201916481 A | 4/2019 |

*Primary Examiner* — Raul J Rios Russo

(57) ABSTRACT

The present invention provides a test connector device for testing a component to be tested having conductive portions. The test connector device includes a base, a terminal block, and a limiting member. The terminal block is disposed on the base. The terminal block includes a substrate and terminals arranged in multiple rows and formed in an integral form with the substrate. Each of the terminals includes a first contact end and a second contact end corresponding to each other. The component to be tested is placed on the limiting member and movably assembled to one side of the base. The limiting member includes a positioning assembly and limiting slots where the first contact ends protrude out. The positioning assembly is movably fastened to the base, so that the first contact ends contact the conductive portions. Accordingly, the present invention enhances reliability, stability, and transmission efficiency during tests.

11 Claims, 13 Drawing Sheets

(56) References Cited

U.S. PATENT DOCUMENTS

| | | | |
|---|---|---|---|
| 2010/0188826 A1* | 7/2010 | Yeh | H05K 1/118 |
| | | | 361/749 |
| 2015/0198678 A1 | 7/2015 | Pilla | |
| 2016/0178663 A1* | 6/2016 | Prabhugoud | G01R 1/0466 |
| | | | 324/750.24 |
| 2017/0294749 A1 | 10/2017 | Tsai | |
| 2023/0275371 A1* | 8/2023 | Eduard | H01H 13/81 |
| | | | 439/850 |

* cited by examiner

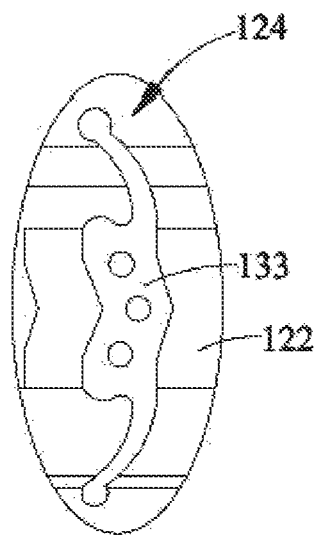 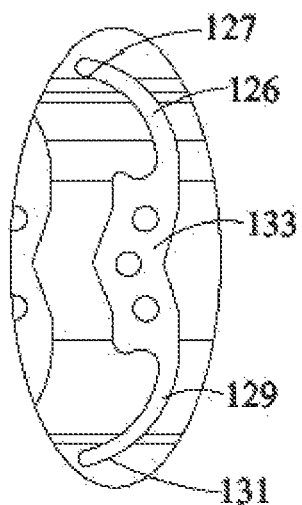 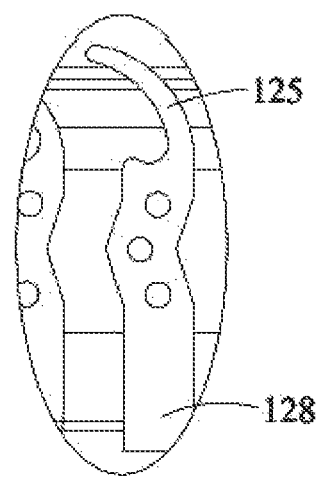
FIG. 4A　　　　　FIG. 4B　　　　　FIG. 4C
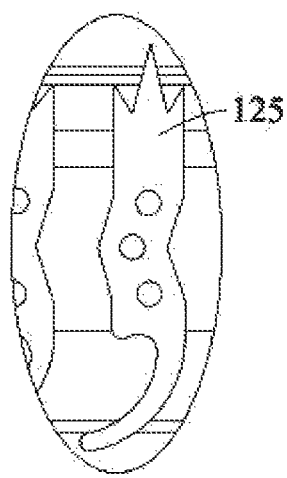 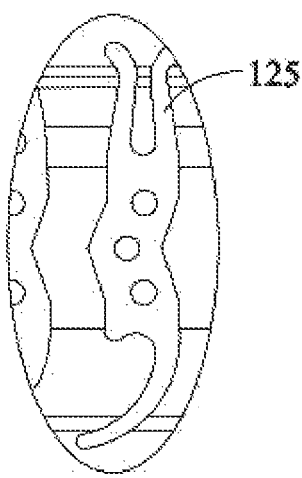 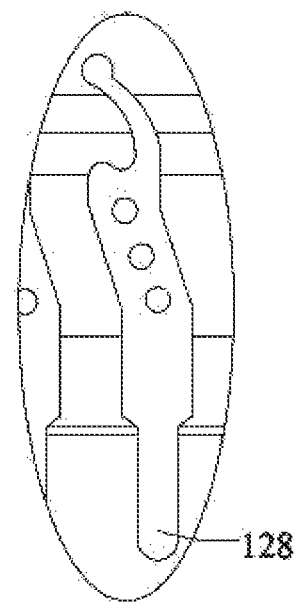
FIG. 4D　　　　　FIG. 4E　　　　　FIG. 4F

TEST CONNECTOR DEVICE AND MANUFACTURING METHOD OF TERMINAL BLOCK THEREOF

CROSS REFERENCE TO RELATED APPLICATION

This application claims priority to Taiwanese Application Serial Number 110140851, filed on Nov. 2, 2021, which is herein incorporated by reference.

FIELD OF DISCLOSURE

The present invention provides a connector device, in particular, a test connector device for a semiconductor integrated circuit with contact pads or bumps and a manufacturing method of a terminal block thereof.

DESCRIPTION OF RELATED ART

Generally, in manufacturing processes of semiconductor chips and integrated circuits, in order to test the characteristics and parameters of the integrated circuits of each chip (IC), before the chips are packaged, the chips with poor electrical functions must be filtered out to ensure that the integrated circuits can function normally and prevent defective products from entering subsequent processes to increase the manufacturing costs. This testing process must take into account the design and density of current and future chips, so electrical connectors must also keep pace with technological development.

In recent years, with the rapid development of integrated circuit technology, a size of semiconductor integrated circuits has been gradually reduced, a chip capacity per unit area has increased, and an operation speed has been increasing. A space or pitch of a conventional probe array has to satisfy an increasing demand for electrical connection of pads or bumps, as well as an increasing demand for planarity. Although a size of a probe of the conventional probe array can be made quite small and close to micron-scale, pitches of the probe cards and scratching between tips of the probes and the contact pads/bumps of the chip will cause the probes to be worn unevenly to reduce a service life of the probes, thereby reducing the test reliability and yield.

In view of this, the inventor of the present invention has devoted himself to study the foregoing conventional techniques and aimed to solve the above-mentioned problems to make improvement.

SUMMARY

It is an objective of the present invention to provide a test connector device and a manufacturing method of a terminal block thereof, which can be used for testing or connecting operations of very fine-pitch semiconductor integrated circuits, thereby improving the test reliability, stability, and transmission efficiency.

It is another objective of the present invention to provide a test connector device and a manufacturing method of a terminal block thereof, which can maintain a direction of each terminal and prevent each terminal from being crooked due to collision by external force, and provide a good support and a restoring structure for restoring the component to be tested after it is tested.

Accordingly, the present invention provides a test connector device for testing a component to be tested, the component to be tested including a plurality of conductive portions, the test connector device including: a base, a terminal block, and a limiting member. The terminal block is disposed on the base. The terminal block includes a substrate and a plurality of terminal rows, and the substrate and the terminal rows have an integral form. Each of the terminal rows includes multiple terminals, and each of the terminals includes a first contact end and a second contact end arranged corresponding to each other. The limiting member positions the component to be tested and is movably assembled to one side of the base. The limiting member includes a positioning assembly and a plurality of rows of limiting slots, and the first contact ends protrude out of the limiting slots. The positioning assembly is movably positioned on the base, and each of the first contact ends contacts one of the conductive portions.

According to one embodiment, the positioning assembly includes a plurality of hooks, a plurality of limit pins, and a plurality of first elastic pieces, each of the hook passes through an open groove of the base and is positioned in the open groove, each of the limit pins is inserted into a limit hole of the base, and each of the first elastic pieces is sleeved on one of the limit pins and accommodated in one of the limit holes to elastically restore the limiting member.

According to one embodiment, when the first elastic pieces restore and push the limiting member, the first contact ends of each of the terminal rows are separated from the conductive portions of the component to be tested, and the limiting member is located at a first position; and when the component to be tested and the limiting member move toward the base, each of the conductive portions abuts one of the first contact ends, and the limiting member is located at a second position.

According to one embodiment, the present invention further includes a guide member disposed on another side of the base, and the guide member includes a plurality of rows of guide through grooves disposed corresponding to the second contact ends, wherein the second contact ends are limited by and protrude from the plurality rows of guide through grooves.

According to one embodiment, the guide member further includes a plurality of elastic buckles, a plurality of guide pins, and a plurality of second elastic pieces, each of the elastic buckles is engaged with a guide groove of the base, each of the guide pins is arranged corresponding to a guide hole of the base, and each of the second elastic pieces is sleeved on one of the guide pins and accommodated in one of the guide holes to elastically restore the guide member.

According to one embodiment, the present invention further includes a carrier plate supporting the base, and the carrier plate includes multiple conductive pads arranged in a plurality of rows and contacting the second contact ends respectively, wherein the guide member is disposed between the base and the carrier plate.

According to one embodiment, the terminal rows form a plurality of terminal groups, the terminal groups are arranged at intervals, and a distance between any two adjacent terminals in each terminal group ranges from 0.4 millimeters (mm) to 0.8 mm, and a distance between the terminal groups ranges from 1.8 to 2.2 mm.

According to one embodiment, a number of the terminal groups is 4, each of the terminal groups is arranged to form an array of 5×10, and in two adjacent terminal groups along the longitudinal direction, the terminals of one terminal group are provided in a face-to-face arrangement with respect to the terminals of the other terminal group.

According to one embodiment, a distance between any two adjacent ones of the terminals in each of the terminal rows ranges from 0.2 mm to 0.9 mm, and a distance between any two adjacent ones of the terminal rows ranges from 0.4 mm to 1 mm.

According to one embodiment, the first contact end of each of the terminals includes a first extension portion and a first top portion connected to the first extension portion, and the second contact end of each of the terminals includes a second extension portion and a second top portion connected to the second extension portion.

According to one embodiment, the limiting member further includes a limit groove on one side facing away from the base, the limit groove accommodates and positions the component to be tested, and a shape of the limit groove corresponds to a shape of the component to be tested.

A manufacturing method of a terminal block, including following steps:

providing at least one base portion;

forming a conductive layer on the at least one base portion, and forming a patterned structure on the conductive layer, so that the patterned structure forms a plurality of terminals arranged in an array on the at least one base portion; and providing an adhesive layer on the terminals, wherein the above steps are repeated to form the terminal block assembled on a substrate and including a plurality of terminal rows.

According to one embodiment, the patterned structure forms a spacer pad and terminal groups located at two sides of the spacer pad by exposure, development, and etching, and the terminals of the terminal groups of the patterned structure are provided in a face-to-face arrangement.

According to one embodiment, a distance between any two adjacent terminals in each terminal group ranges from 0.4 millimeters (mm) to 0.8 mm, a distance between the terminal groups ranges from 1.8 mm to 2.2 mm, and in two adjacent terminal groups along the longitudinal direction, the terminals of one terminal group are provided in a face-to-face arrangement with respect to the terminals of the other terminal group.

According to one embodiment, a distance between any two adjacent terminals in each of the terminal rows ranges from 0.2 mm to 0.9 mm, and a distance between any two adjacent terminal rows ranges from 0.4 mm to 1 mm.

The test connector device of the present invention not only has the convenience of assembly and design flexibility, but also can be quickly used in current package test equipment and various electronic equipment. The terminal block and the base can be integrally formed or assembled. The terminals of the terminal block have small-spacing, high-strength, high-conductivity, and low-impedance, and therefore, when transmitting signals or currents, the present invention can alleviate a temperature rising problem caused by high impedance, which improves the overall transmission efficiency and prolongs a service life. In addition to that, the various elastic designs of the terminals can also be adapted to the current application of various current testing equipment. Furthermore, the test connector device of the embodiment has a good supporting and elastic structure, which can well restore the component to be tested disposed on the limiting plate, thereby improving the test yield and production efficiency.

According to the requirements of the component to be tested, the manufacturing method of the terminal block can perform modular lamination, so that the base portions, the conductive layer, and the adhesive layer are repeatedly stacked to form a structure in which the terminals and the substrate are formed in an integral form. The terminals have good mechanical and electrical properties, such as good conductivity, and prevent the first contact ends and the second contact ends from being damaged due to excessive bending when subjected to force. The terminals have advantages such as high strength, low impedance, and greatly reduced pitches.

BRIEF DESCRIPTION OF DRAWINGS

In order to make the above-mentioned content of the present invention easy to understand, the present invention is described below with reference to the preferred embodiments and in combination with the accompanying drawings:

FIGS. 4A to 4F are schematic views illustrating terminals according to various embodiments of the present invention.

DETAILED DESCRIPTION OF EMBODIMENTS

Figure 1:
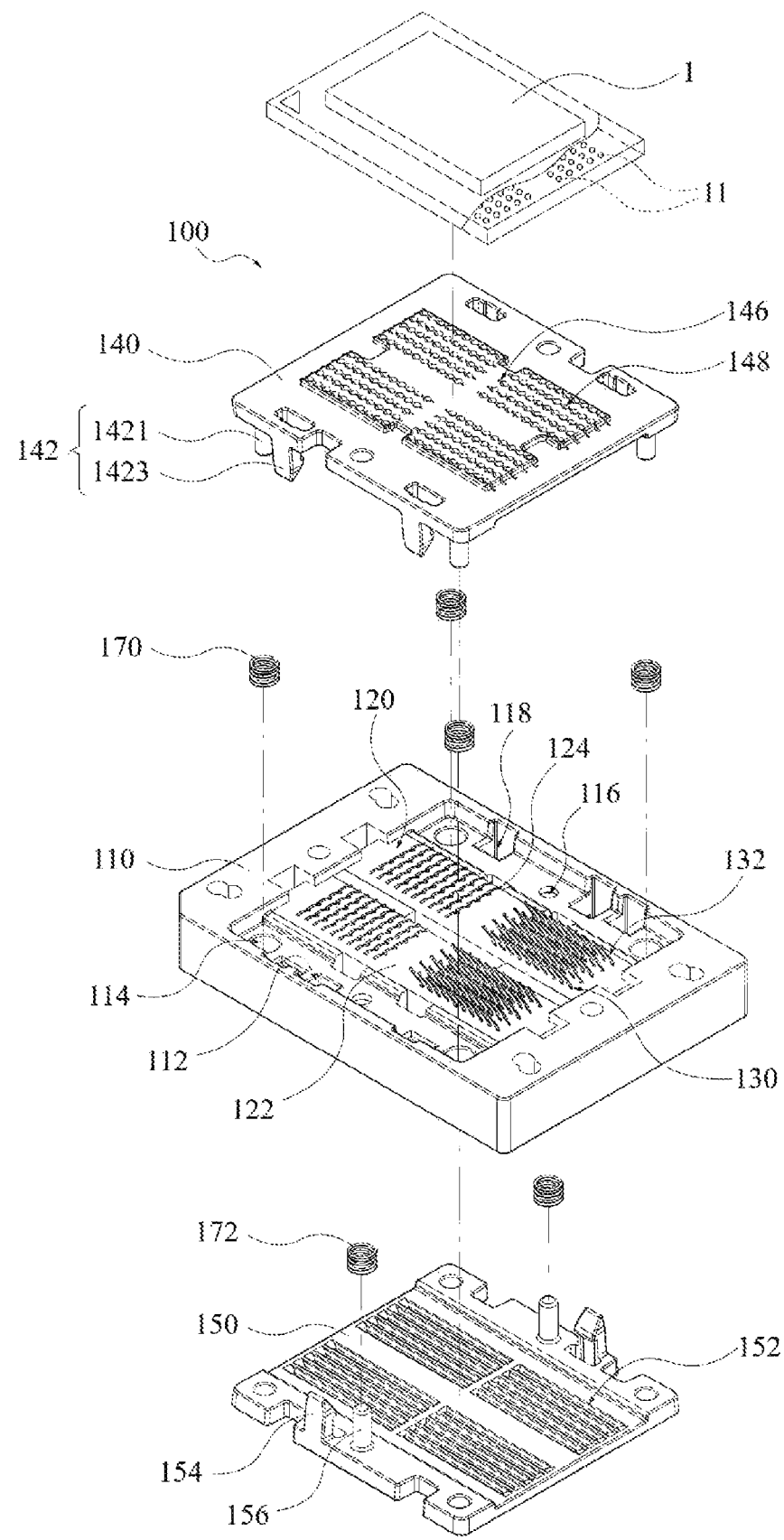
FIG. 1 is a schematic view of a test connector device according to a first embodiment of the present invention.

Please refer to the drawings. The same reference numerals are used to denote the same or similar component. Working principles of the present disclosure are described by examples implemented in a suitable environment. The following description is based on some embodiments of the present disclosure and should not be construed as limiting other embodiments of the present disclosure not detailed herein.

Figure 2:
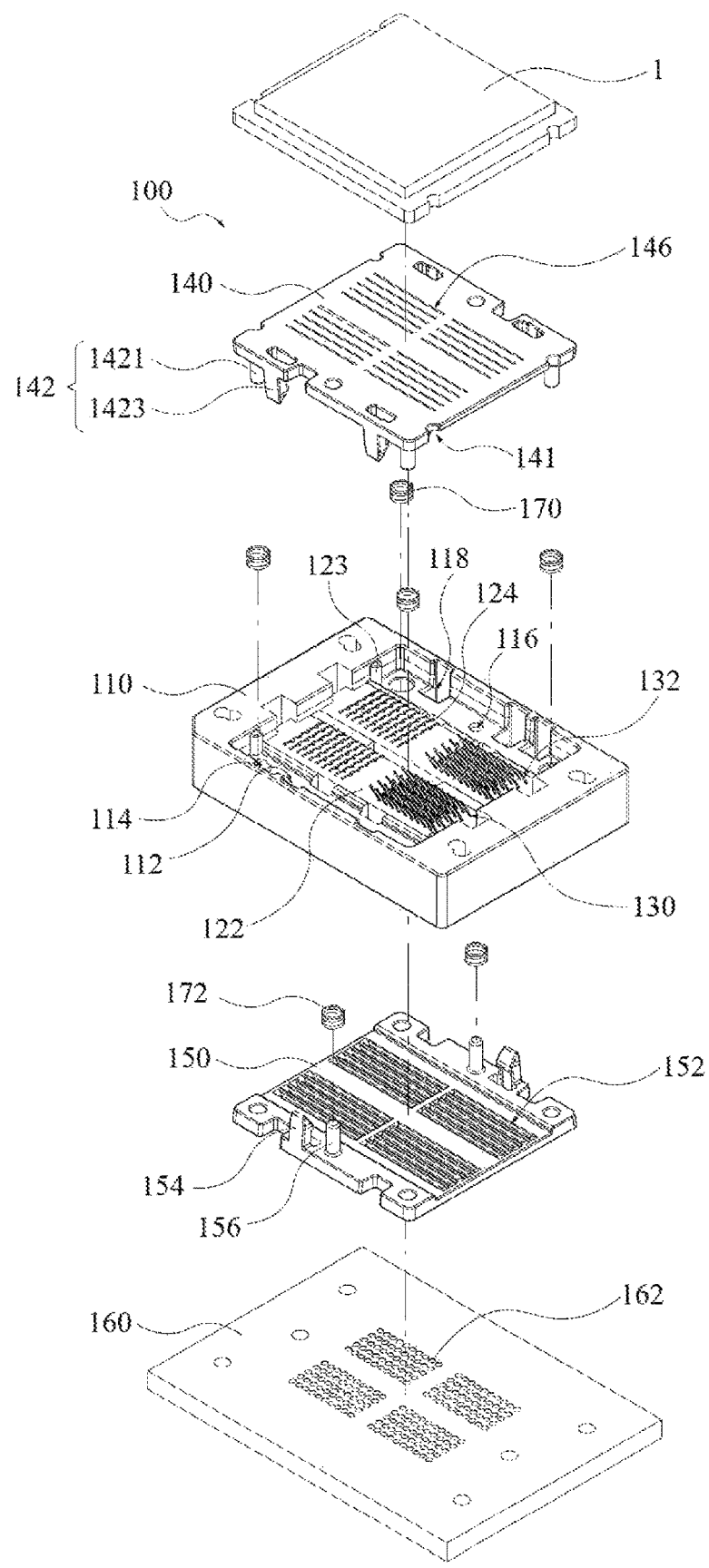
FIG. 2 is a schematic view of the test connector device according to a second embodiment of the present invention.

As shown in FIG. 1, the present invention provides a test connector device 100 for testing a component to be tested 1 including a plurality of conductive portions 11. In a first embodiment of FIG. 1, the component to be tested 1 is preferably a computer CPU chip with a ball grid array (BGA) package technology or other chip (IC) with solder balls 11. However, in a second embodiment as shown in FIG. 2, the component to be tested 1 can also be a computer CPU chip or a dynamic random access memory (DRAM)

with a land grid array (LGA) package technology or other chips with a flat surface (not illustrated).

The test connector device 100 includes a base 110, a terminal block 120, and a limiting member 140. The terminal block 120 is disposed on the base 110. In the embodiment shown in FIG. 1, the terminal block 120 is preferably fixed to the base 110 by being assembled to the base 10. However, in alternative embodiments, the terminal block 120 can also be combined with the base 110 by insert molding, which can be changed as needed. The terminal block 120 includes a substrate 122 and a plurality of rows of terminals 124 integrally formed with the substrate 122. A manufacturing method of the terminal block 120 is described in detail below.

The positioning assembly 142 includes at least one hook 1423, at least one limit pin 1421 and at least one first elastic piece 170. The hook 1423 is inserted through a open groove 118 of the base 110 and is positioned in the open groove 118. The limit pin 1421 is inserted into a limit hole 114 of the base 110. The first elastic piece 170 is sleeved on the limit pin 1421 and accommodated in the limit hole 114 to elastically restore the limiting member 140. In the embodiment shown in FIG. 1, the numbers of the hooks 1423, the limit pins 1421, and the first elastic pieces 170 are respectively four, but the present embodiment is not limited in this regard. Specifically, the first elastic piece 170 can be sleeved on the limit pin 1421 of the positioning assembly 142 and accommodated in the limit hole 114 of the base 110 so as to be limited in the limit hole 114.

In the embodiment shown in FIG. 2, the component to be tested 1 with the LGA package technology also has a foolproof mechanism (not illustrated). Accordingly, in order to facilitate assembling, the limiting member 140 further includes a plurality of positioning notches 141 arranged correspondingly. The base 110 comprises a plurality of positioning ribs 123 arranged corresponding to the positioning notches 141, which facilitates more convenient and rapid assembling or testing operations, and prevents wrong assembly or testing errors.

Figure 3A:
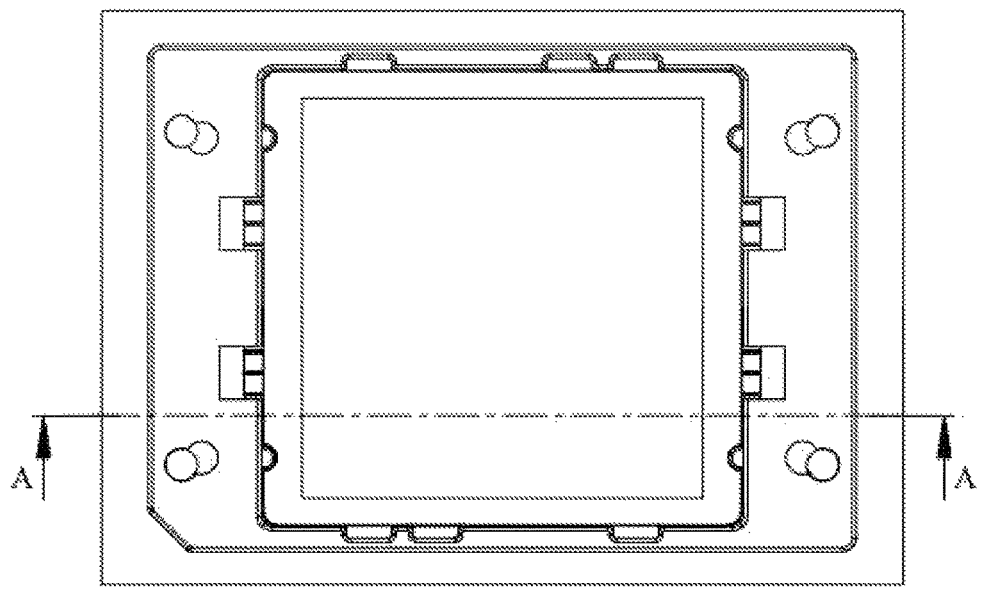
FIG. 3A is a cross-sectional view of FIG. 2 taken along line A-A.
Figure 3A:
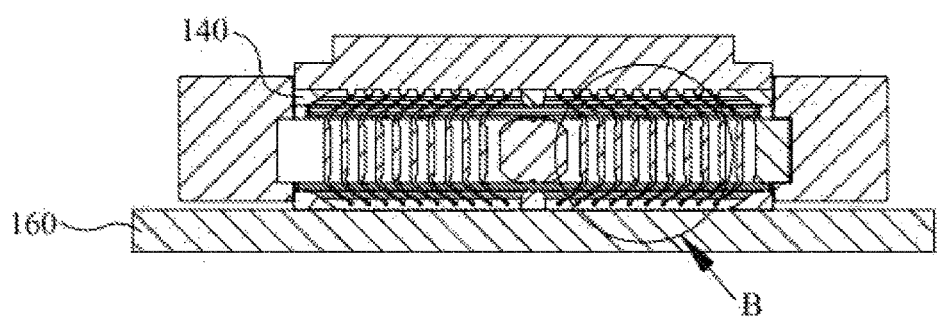
Figure 3B:
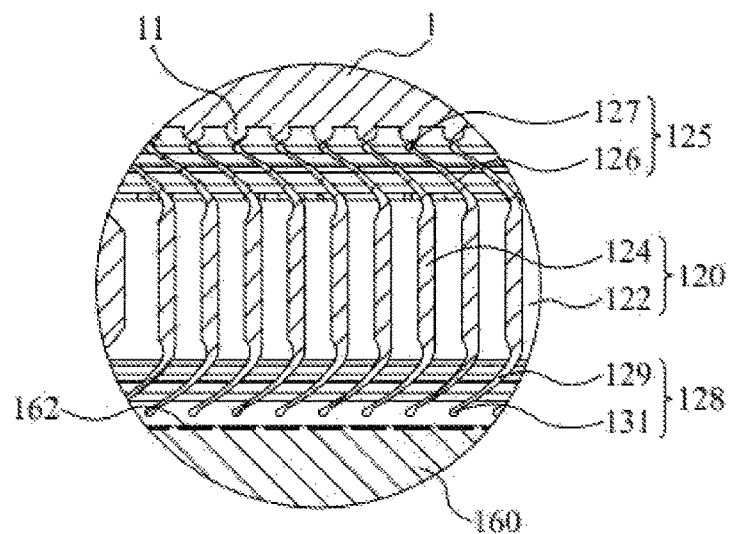
FIG. 3B is an enlarged view of FIG. 3A at position B.
Figure 5A:
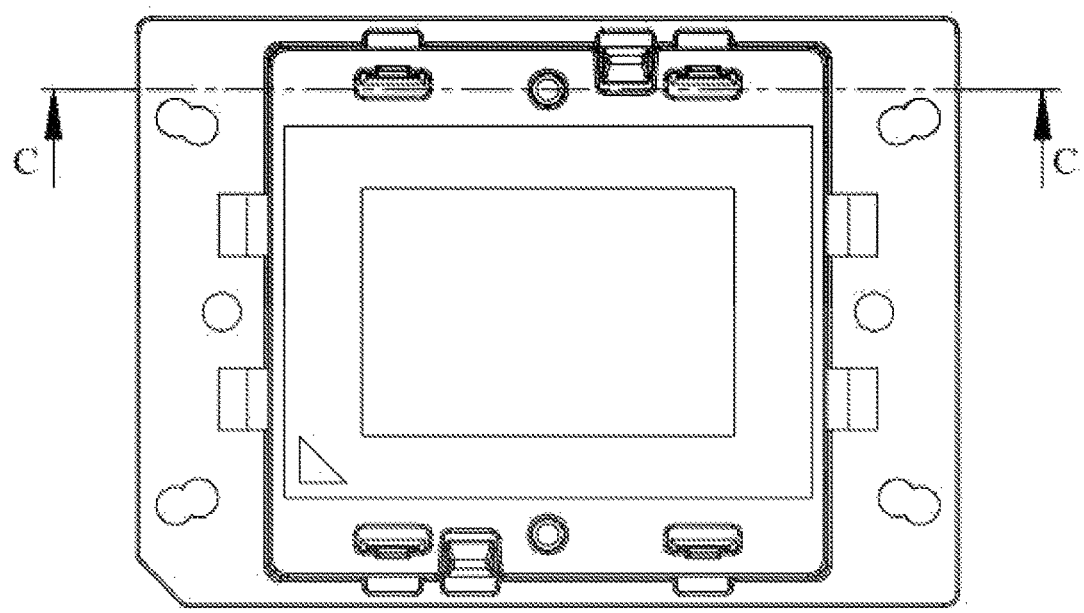
FIG. 5A is a cross-sectional view taken along line C-C illustrating the test connector device of the present invention.
Figure 5A:
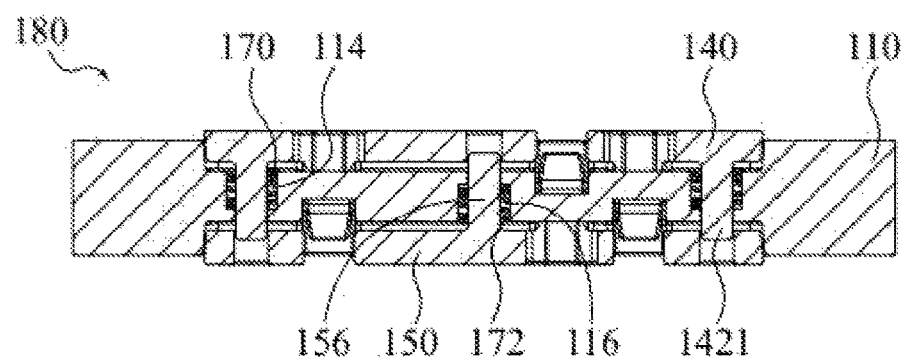
Figure 5B:
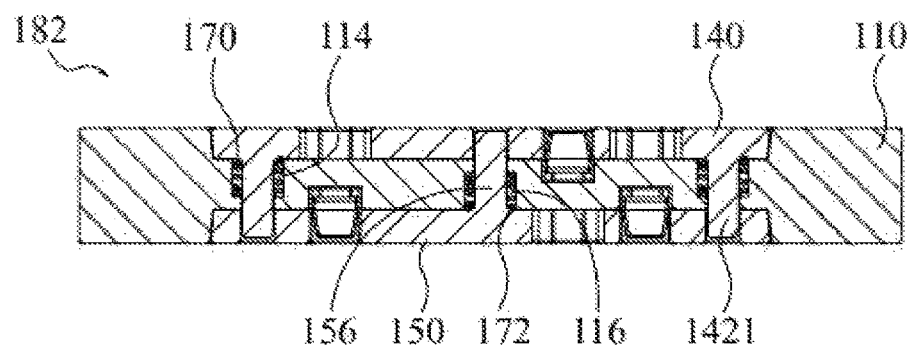
FIG. 5B is a schematic operation view at another position of FIG. 5A.

Referring to FIG. 3A and FIG. 3B together, each of the terminals in each row 124 includes a first contact end 125 and a second contact end 128 corresponding to each other. The component to be tested 1 is disposed on one side of the limiting member 140, and the limiting member 140 is movably assembled on one side of the base 110. The limiting member 140 includes a positioning assembly 142 and a plurality of rows of limiting slots 146. The first contact ends 125 protrude out of the limiting slots 146. Each limiting slot 146 further includes a plurality of through holes 148 that are spaced apart and communicate with each other, and the through holes 148 are arranged corresponding to the first contact ends 125, respectively. A shape of each limiting slot 146 is preferably an elongated through hole, and a shape of each through hole 148 is preferably a circle; however, the present invention is not limited in this regard. A diameter of each through hole 148 is greater than a width of a portion connecting the limiting slots 146, so that a first top portion 127 of each first contact end 125 can be easily inserted through the corresponding through hole 148 and be limited therein, so as to maintain a direction of each first contact end 125 and prevent the first contact end 125 from being crooked due to collision by external force, thereby prolonging a service life of the terminals 124 and the terminal block 120.

In the embodiment shown in FIG. 1, the present invention further includes a guide member 150 disposed on another side of the base 110 and/or the terminal block 120. The guide member 150 includes a plurality of rows of guide through grooves 152 corresponding to the second contact ends 128. The second contact ends 128 are limited by and protrude from the plurality of rows of guide through grooves 152. The guide member 150 further includes at least one elastic buckle 154, at least one guide pin 156, and at least one second elastic piece 172. The elastic buckle 154 is engaged with a guide groove 112 of the base 110, the guide pin 156 is disposed corresponding to a guide hole 116 of the base 110, and the second elastic piece 172 is sleeved on the guide pin 156 and accommodated in the guide hole 116 to elastically restore the guide member 150. In the embodiment shown in FIG. 1, the numbers of the elastic buckles 154, the guide pins 156, and the second elastic pieces 172 are respectively two; however, the present embodiment is not limited in this regard. In addition, the first elastic piece 170 and the second elastic piece 172 described herein are, for example, compression springs, elastic sheets, or other suitable elements, and the present invention is not limited in this regard.

The limiting member 140 is downwardly assembled to one side of the base 110 by means of the positioning assembly 140. The guide member 150 is assembled to another side of the base 110 by means of the elastic buckle 154 and the guide pin 156, and an assembling direction of the guide member 150 is opposite to an assembling direction of the limiting member 140. The limiting slots 146 of the limiting member 140 and the guide through grooves 152 of the guide member 150 can effectively maintain directions of the terminals 124 and prevent the terminals 124 from being crooked due to collision by external force. In addition, an overall structural design of the limiting member 140, the guide member 150, and the terminal base 120 can be quickly adjusted and modified according to the testing requirements of the component to be tested 1.

As shown in FIG. 2, the second embodiment of the present invention further includes a carrier plate 160 for supporting the base 110. The carrier plate 160 includes a plurality of rows of conductive pads 162 in contact with the respective second contact ends 128. The guide member 150 is disposed between the base 110 and the carrier plate 160. In the present embodiment, the carrier plate 160 is preferably a mother board, which is connected to a testing machine (not illustrated) through the conductive pads 162 for detecting and transmitting signals.

In the embodiment shown in FIG. 1 and FIG. 2, terminal rows 130 form a plurality of terminal groups 132 according to the corresponding conductive portions 11. For example, four terminal groups 132 having an array of 5×10, that is, 200 terminals 124 in total; however, the present embodiment is not limited in this regard. The terminal groups 132 are spaced apart from each other, wherein in two adjacent terminal groups 132 along the longitudinal direction, the terminals 124 of one terminal group 132 are arranged facing the terminals of the other terminal group 132. A distance between any two adjacent terminals 124 in each terminal row 130 is 0.4 to 0.8 millimeters (mm), and is preferably 0.65 mm in this embodiment. A distance between the terminal groups 132 ranges from 1.8 to 2.2 mm, and is preferably 1.95 mm in this embodiment. However, in alternative embodiments, the distance between the terminals 124 and the distance between the terminal groups 132 can be changed according to needs or designs, and the present invention is not limited in this regard.

In the present embodiment, each terminal 124 can be changed according to needs for being used, as shown in FIG. 4A to FIG. 4F. In the embodiment shown in FIG. 4A and FIG. 4B, the first top portion 127 and a second top portion 131 of each terminal 124 can be designed to be circular, flat, or a combination thereof according to requirements. As shown in FIG. 4C, the second contact end 128 can use surface mount technology (SMT) and is electrically welded to, for example, the conductive pad 162. As shown in FIG. 4D, the first contact end 125 is capable of piercing, which can directly pierce a wire (not illustrated). The first contact end 125 in FIG. 4E is capable of clamping, and can clamp a metal part (not illustrated). The second contact end 128 in FIG. 4F employs a dual in-line package (DIP), which can be inserted and fixed to the circuit board (not illustrated). In addition to the above-mentioned various structures of the terminals 124, the embodiment also includes, for example, a spring connector (POGO Pin) or other pogo pins, etc., and the present embodiment is not limited in this regard.

Figure 6A:
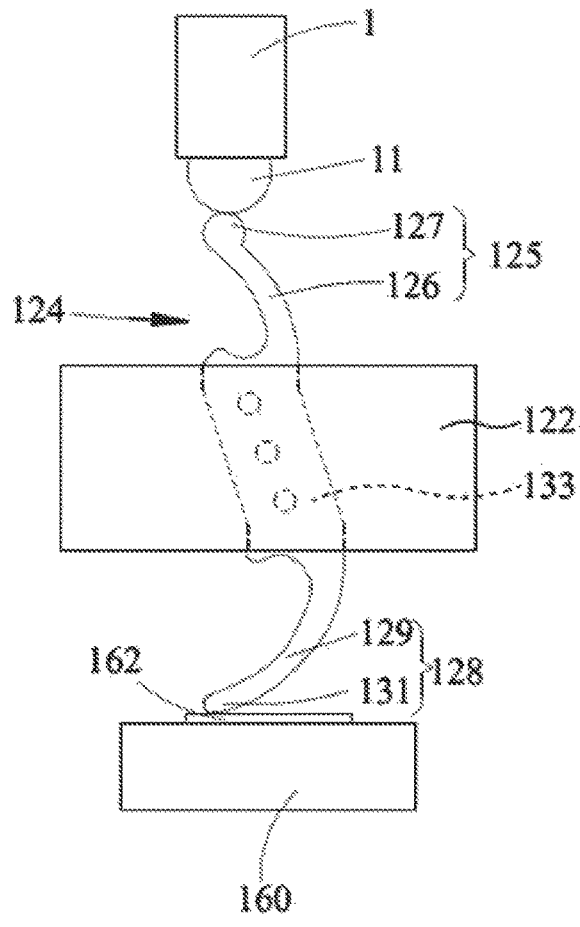
FIG. 6A is a schematic view illustrating the terminal in a state of not being compressed according to the first embodiment of the present invention.
Figure 6B:
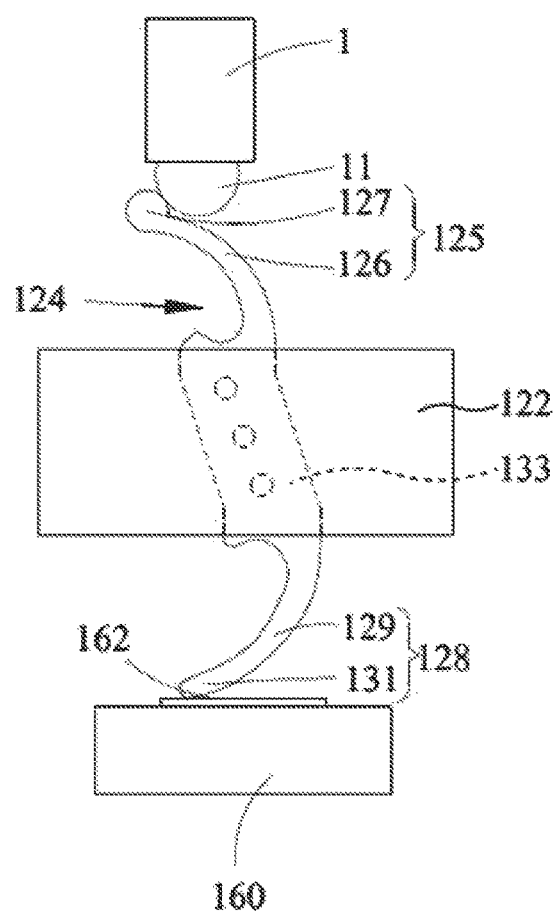
FIG. 6B is a schematic view illustrating the terminal in a state of being compressed according to the first embodiment of the present invention.

The first contact end 125 of each terminal 124 includes a first extension portion 126 and a first top portion 127 connected to the first extension portion 126. The second contact end 128 includes a second extension portion 129 and a second top portion 131 connected to the second extension portion 129. A fastening portion 133 connecting the first contact end 125 and the second contact end 128 can be positioned in the substrate 122, as shown in FIGS. 6A and 6B.

When the component to be tested 1 is positioned on the limiting member 140 and tested, the limiting member 140 can provide an elastic restoration function required for repeated pressing, and the guide member 150 can also provide elasticity to protect each terminal 124. Specifically, referring to FIGS. 3A, 3B, 5A, and 5B together, when the first elastic piece 170 pushes the limiting member 140 elastically (releasing an elastic restoration force), the first contact ends 125 of each row of the terminals 124 are separated from the conductive portions 11 of the component to be tested 1, and at this point, the limiting member 140 is located at a first position 180 (as shown in FIG. 6A). When the component to be tested 1 and the limiting member 140 move toward the base 110 together, each conductive portion 11 presses down against one of the first contact ends 125, and at this point, the limiting member 140 is located at a second position 182 (as shown in FIG. 6B). When the limiting member 140 is located at the second position 182, signals of the conductive portions 11 of the component to be tested 1 can be transmitted to the conductive pads 162 of the carrier plate 160 through the first contact ends 125 and the second contact ends 128 of the terminals 124, so that the present invention can test whether each conductive portion 11 has good electrical characteristics or circuit connection.

The plurality rows of terminals 124 of the terminal block 120 have small-spacing, high-strength, high-conductivity, and low-impedance. Therefore, when transmitting signals or currents, the present invention can alleviate a temperature rising problem caused by high impedance, which improves the overall transmission efficiency and prolongs a service life. In addition to that, the various elastic designs of the terminals 124 can also be adapted to the current application of various current testing equipment. Furthermore, the test connector device 100 of the embodiment has a good supporting and elastic structure, which can well restore the component to be tested 1 disposed on the limiting plate 140, thereby improving the test yield and production efficiency.

Figure 7:
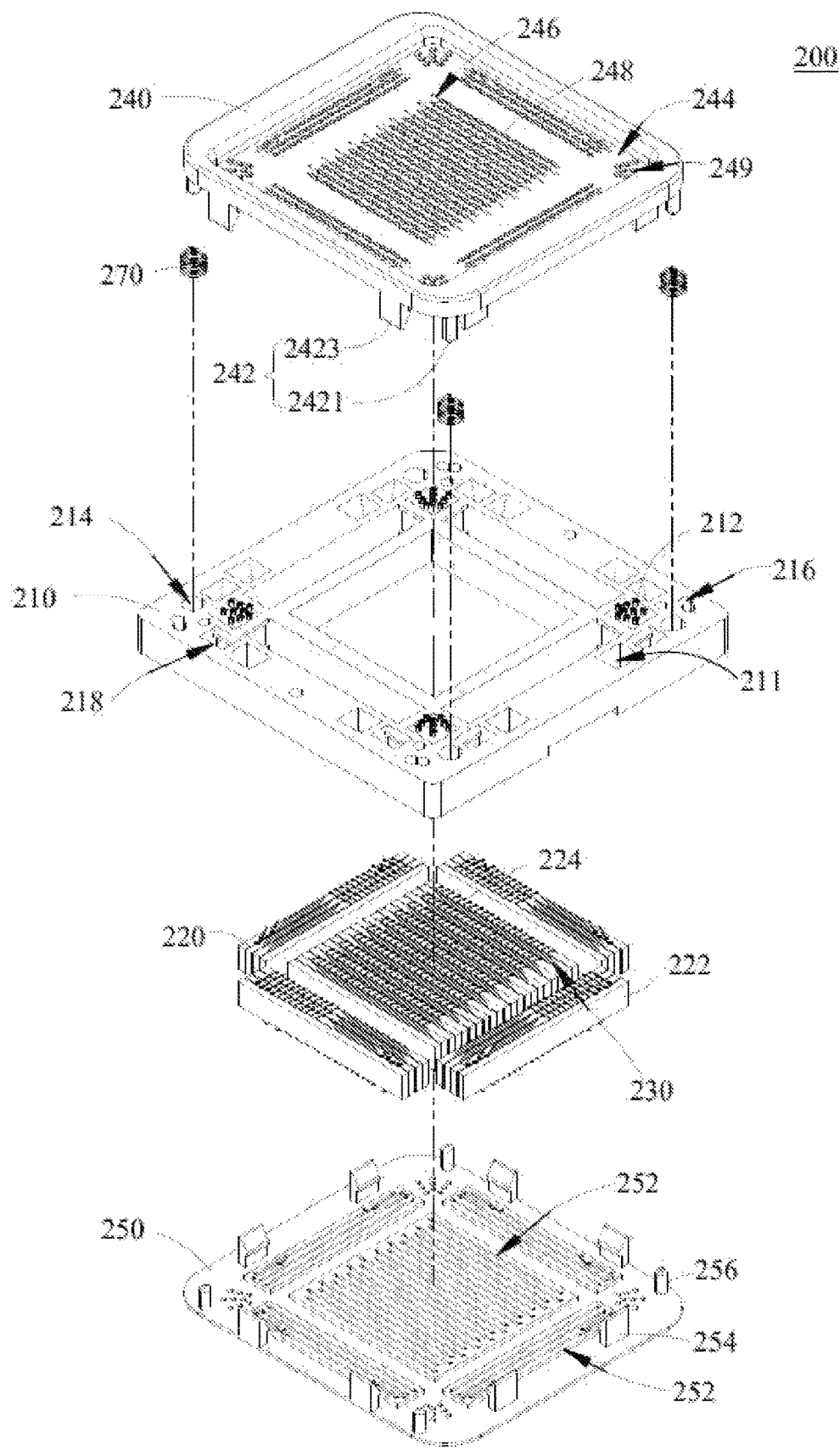
FIG. 7 is a schematic view of the test connector device according to a third embodiment of the present invention.
Figure 8:
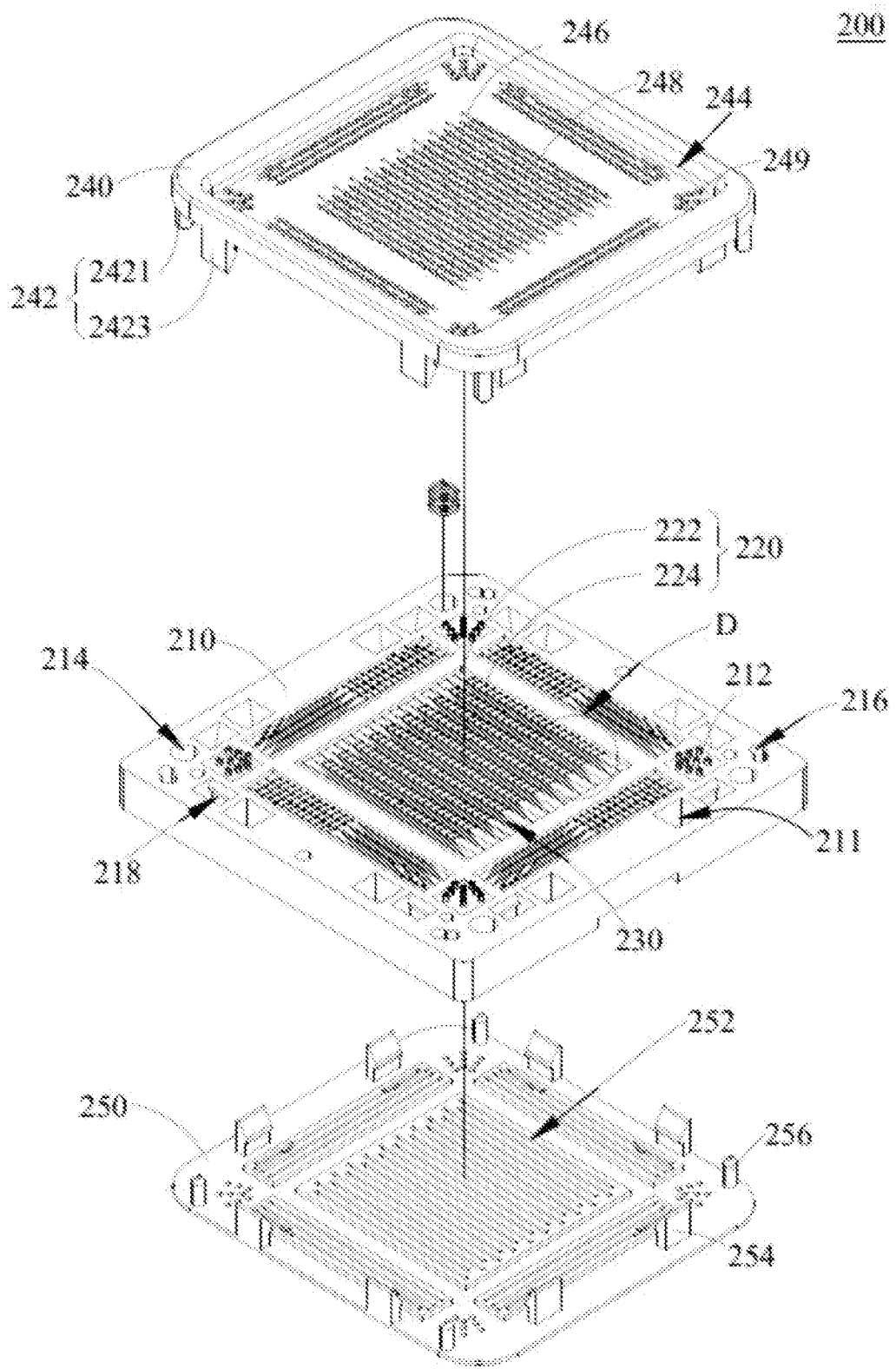
FIG. 8 is another assembled perspective view of FIG. 7.

Please refer to FIG. 7 and FIG. 8 together, which are exploded perspective views according to a third embodiment of the present invention. The present embodiment and the first two embodiments are mainly different in the components to be tested (not illustrated). Specifically, the component to be tested in this embodiment is preferably an integrated circuit (application specific integrated circuit; ASIC) or a chip with other special specifications; however, the present embodiment is not limited in this regard. The overall structural design of a limiting member 240, a guide member 250, and a terminal block 220 in the present embodiment can be adjusted and changed according to the testing requirements of the component to be tested 1, as described below. For other structural details and connection relationships of the present embodiment, please refer to the descriptions in the foregoing embodiments, and details are not repeated here.

The conductive portions (not illustrated) of the component to be tested 1 are more densely arranged and have finer pitches, and a manufacturing method of the terminal block 120 in this embodiment is the same as that in the previous embodiment, but the arrangement of terminal rows 230 has a different design based on the arrangement of the conductive portions (not illustrated).

Figure 9:
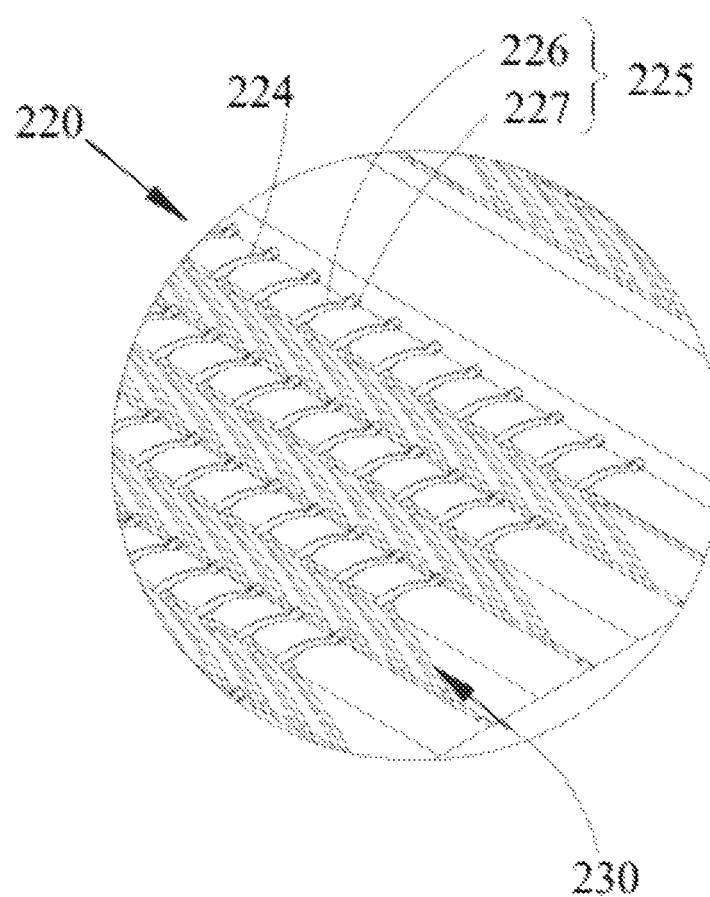
FIG. 9 is an enlarged schematic view of FIG. 8 at position D.

Please also refer to FIG. 9, which is an enlarged schematic view at position D of FIG. 8. Specifically, the terminals 224 of any two adjacent terminal rows 230 are arranged facing opposite directions, and the distance between any two adjacent terminals 224 in each terminal row 230 is 0.2 to 0.9 mm, preferably 0.65 mm. In addition, the distance between any two adjacent terminal rows 230 is 0.4 to 1 mm, preferably 0.8 mm. However, in alternative embodiments, the distance between the terminals 124 and the distance between any two adjacent terminal rows 230 can be adjusted as required.

In particular, the base 210 further includes a plurality of probe sets 212 and a plurality of positioning holes 216 for different designs and structures of the component to be tested 1. In the embodiment shown in FIG. 7 and FIG. 8, the probe sets 212 are preferably disposed at four corners of the base 210 respectively. In alternative embodiments, each probe set 212 can also be changed into the terminal structure of the foregoing embodiment according to different requirements, and the present invention is not limited in this regard. The limiting member 240 and the guide member 250 assembled on the base 210 are respectively provided with first probe through holes 249 and second probe through holes (not labeled) corresponding to the probe sets 212, so that each probe set 212 transmits signals or currents from the conductive portions of the component to be tested to the conductive pads (not illustrated) on the carrier plate of a testing machine. In addition, the guide member 250 is also provided with limit pins 256 corresponding to the positioning holes 216, so as to be accurately positioned on the base 110. It should be noted that the terminals 224 in this embodiment have a structure similar to the terminals 124 in the previous two embodiments, and are arranged in different ways according to the component to be tested 1. For the rest of the structure of this embodiment, please refer to the descriptions in the previous embodiment, and details are not repeated here.

In addition, in the embodiment shown in FIG. 7 and FIG. 8, the limiting member 240 further includes a limit groove 244 for accommodating the component to be tested 1, so as to increase the positioning effect and prevent the component to be tested 1 from being crooked. A shape of the limit groove 244 corresponds to a shape of the component to be tested 1 and is, for example, rectangular or circular; however, the present invention is not limited herein. In addition to the various structures of the terminals 124 of the foregoing embodiments, each terminal row 230 in this embodiment also includes, for example, a spring connector (POGO pin) or other pogo pins, and the present invention is not limited in this regard.

Figure 10A:
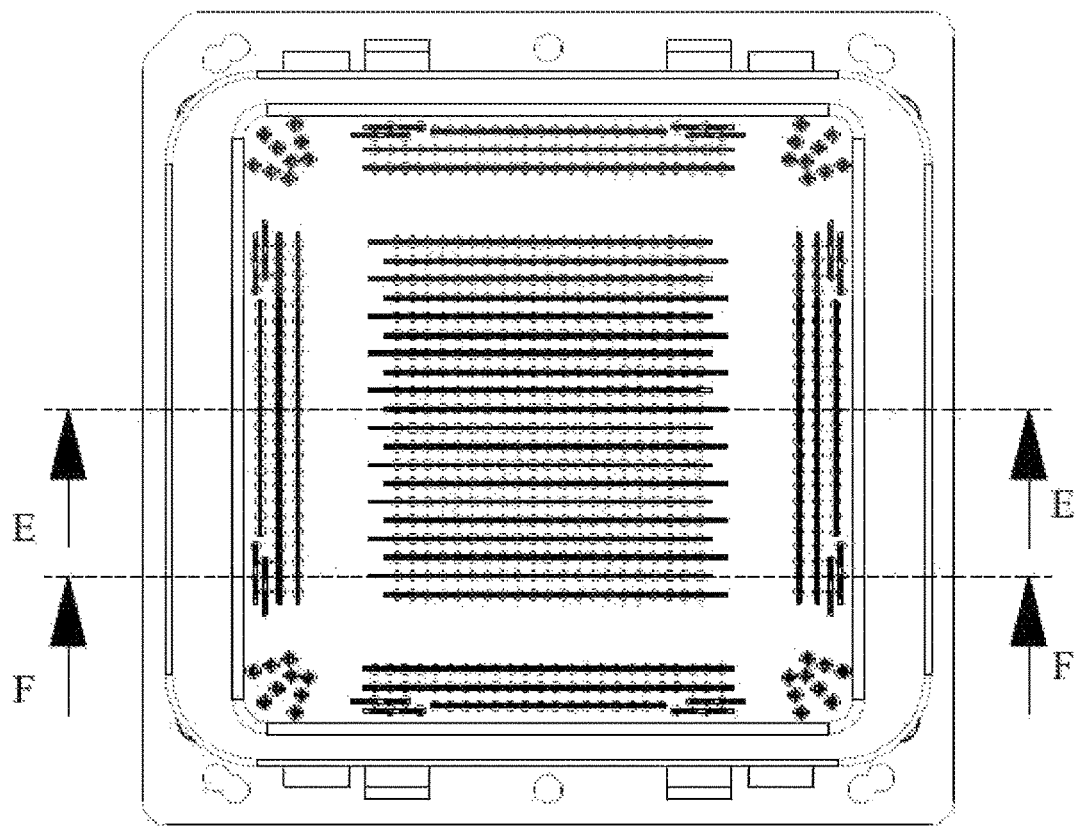
FIG. 10A is a cross-sectional view taken along line E-E illustrating the test connector device of the present invention.
Figure 10A:
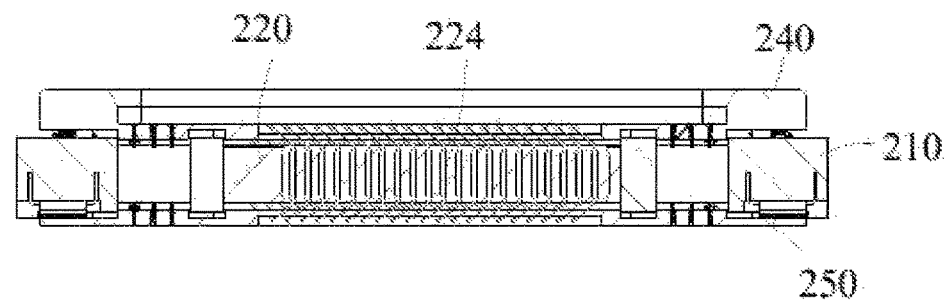
Figure 10B:
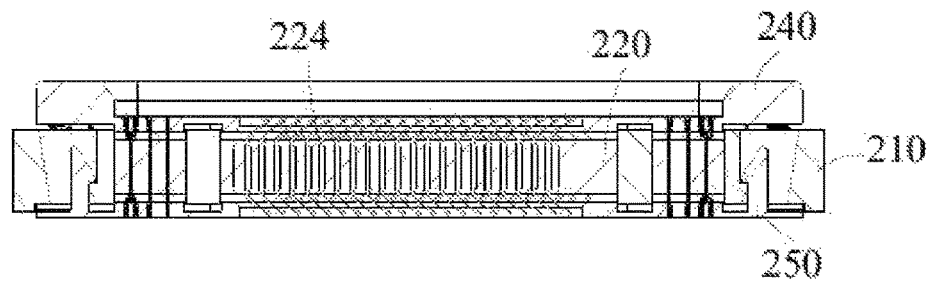
FIG. 10B is a cross-sectional view of FIG. 10A taken along line F-F.
Figure 11A:
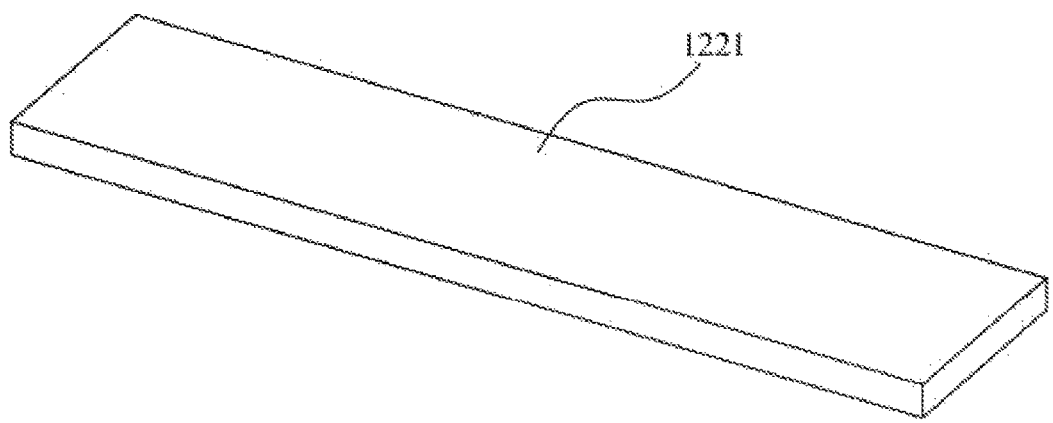
FIGS. 11A to 11I are schematic structural views illustrating a manufacturing process of a terminal block of the present invention.
Figure 11B:
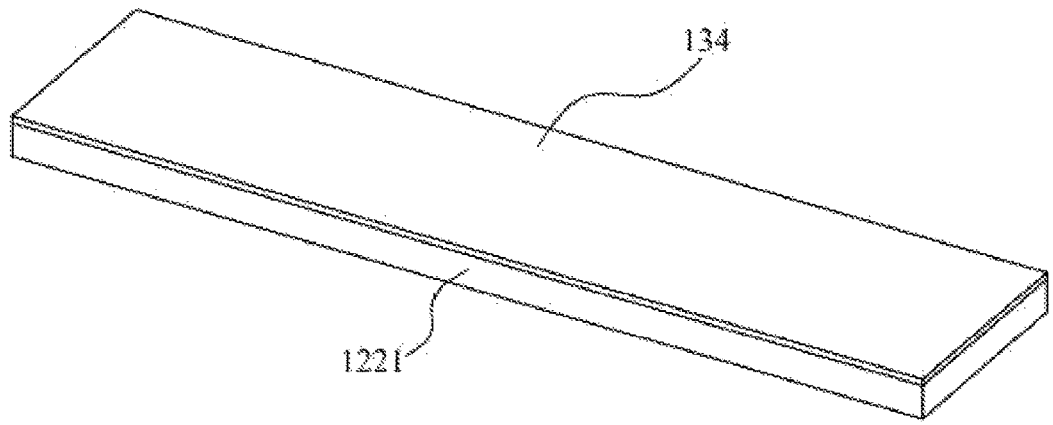
Figure 11C:
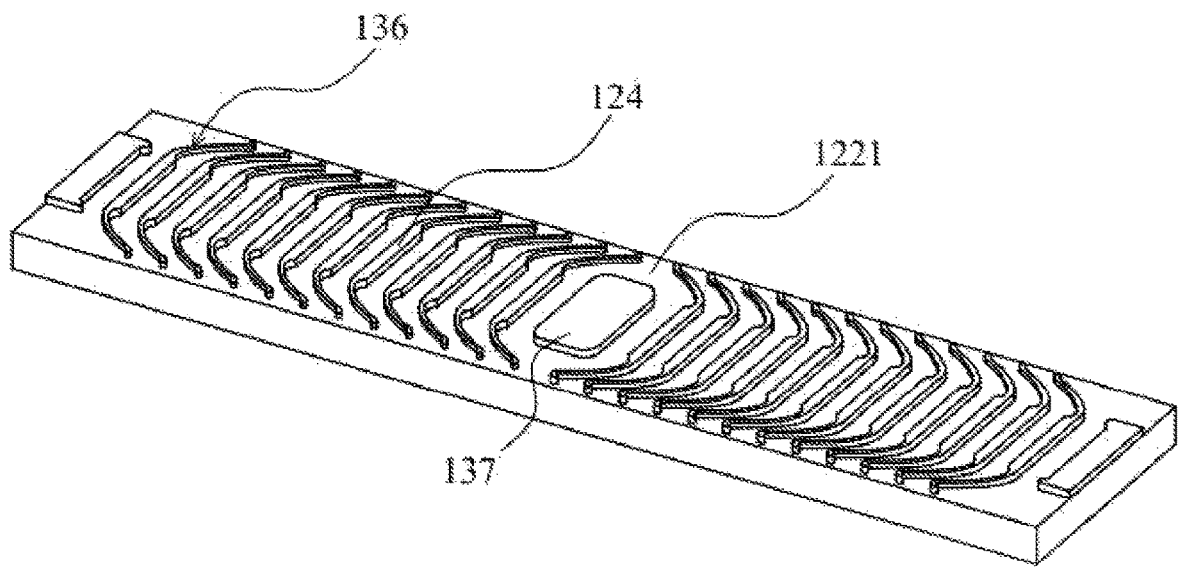
Figure 11D:
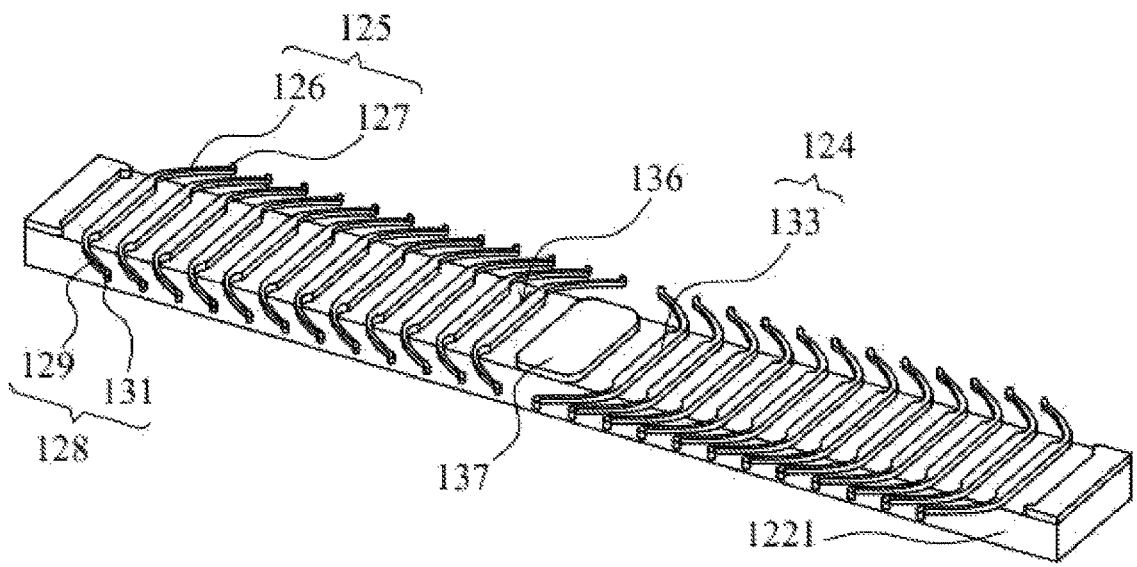
Figure 11E:
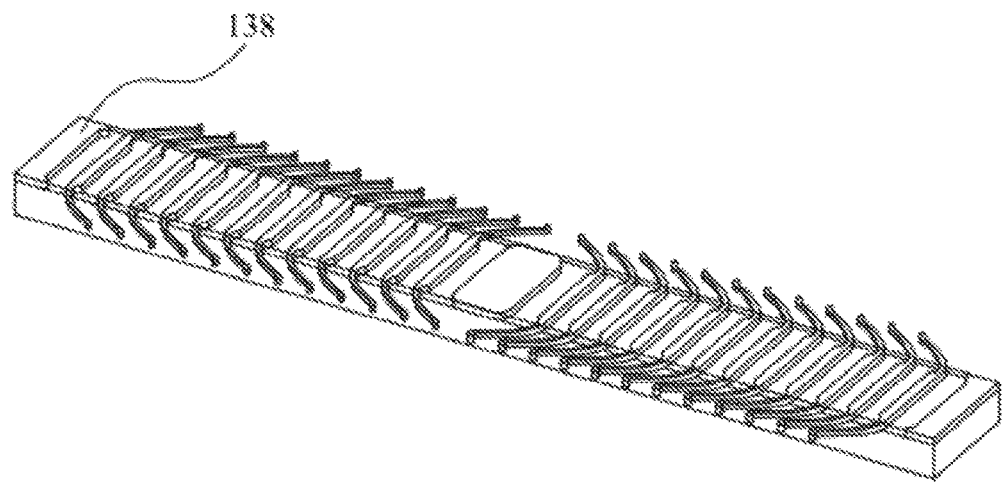
Figure 11F:
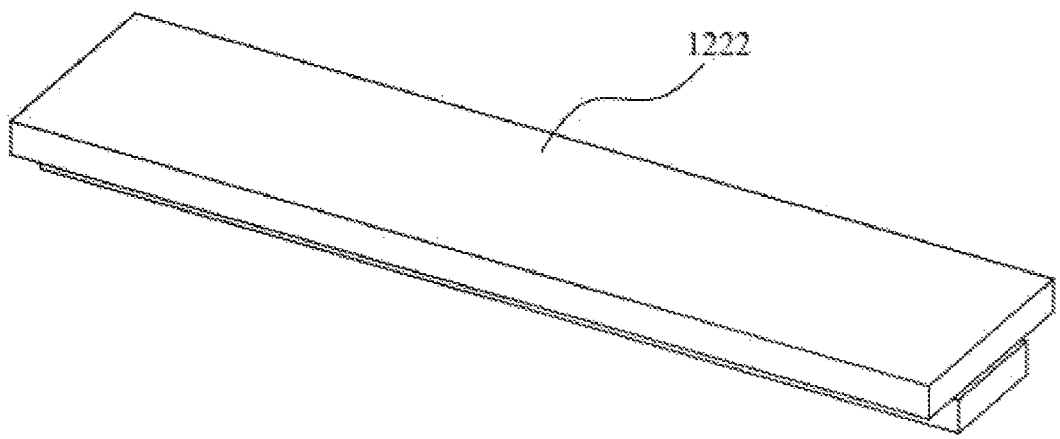
Figure 11G:
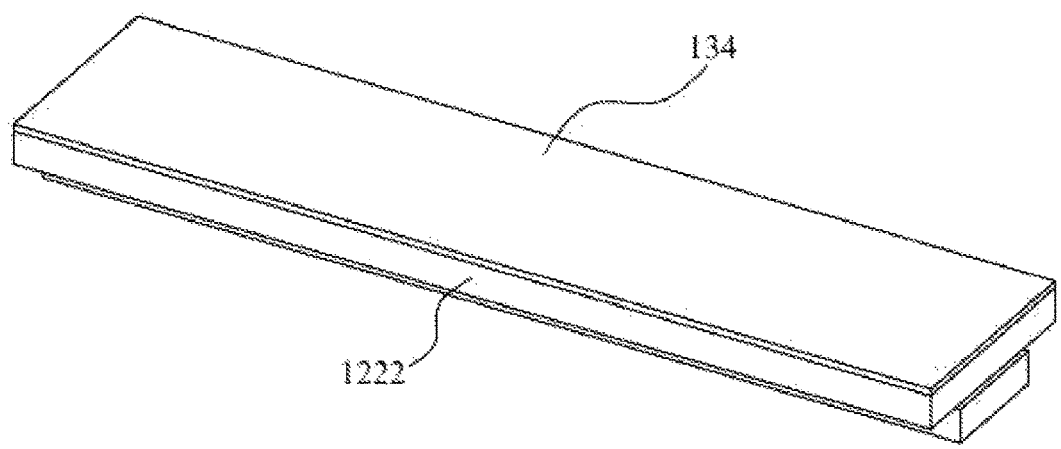
Figure 11H:
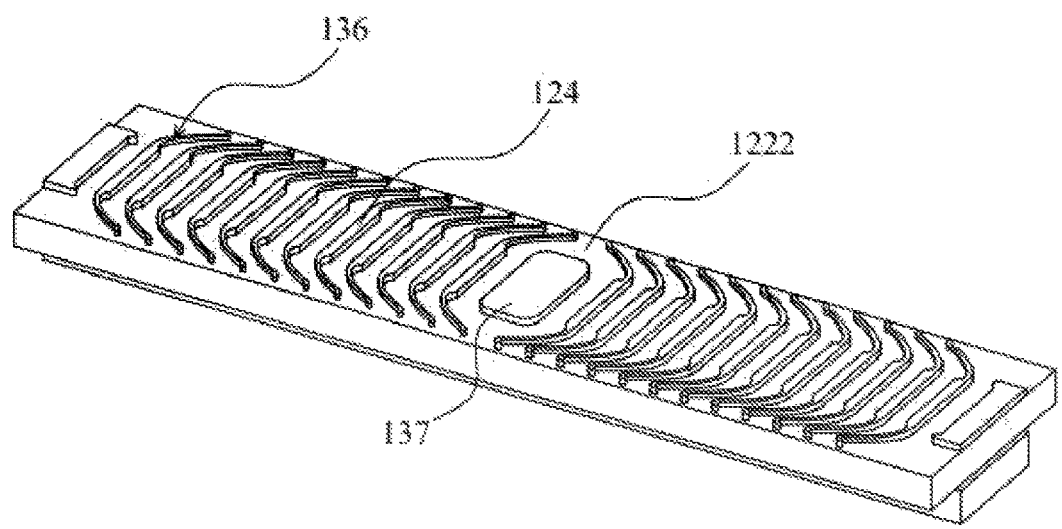
Figure 11I:
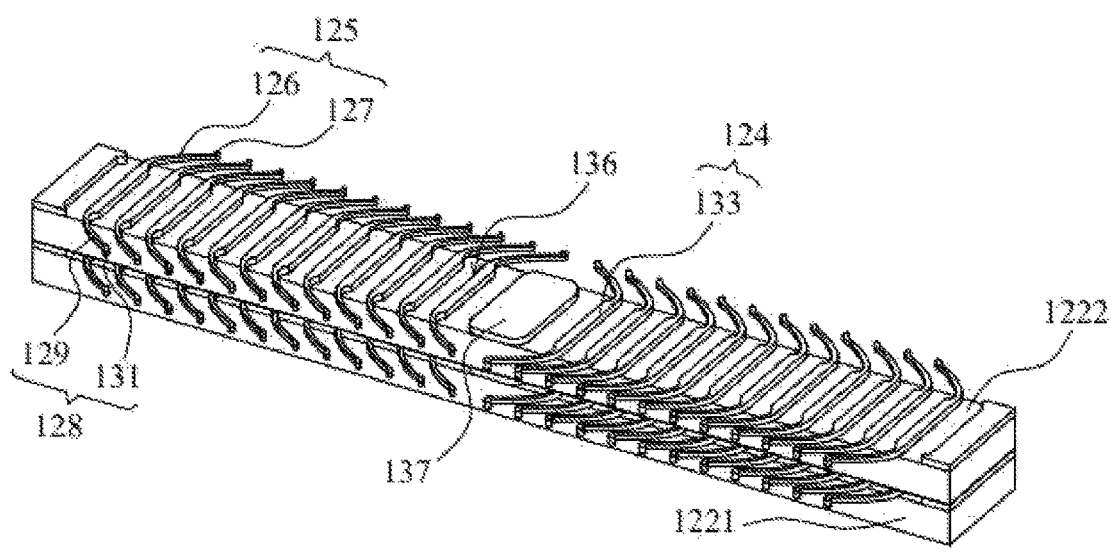

Please refer to FIG. 10A and FIG. 10B together. Similarly, when a first elastic piece 270 restores the limiting member 240 (releases the elastic restoration force), the first contact ends 225 of the terminals 224 are detached from the conductive portions 11 of the component to be tested. At this point, the limiting member 240 is located at a first position (not illustrated). When the component to be tested 1 and the limiting member 240 move toward the base 210, the conductive portions 11 press down against the first contact ends 225. At this point, the limiting member 240 is located at a second position (not illustrated). When the limiting member 240 is located at the second position, signals of the conductive portions 11 of the component to be tested 1 can be transmitted to the conductive pads (not illustrated) of a motherboard (not illustrated) of the testing machine through the first contact ends 225 and the second contact ends of the terminals 224, so as to test whether the electrical characteristics or circuit connections of the conductive portions 11 are good or not.

The test connector device 200 of the present embodiment not only has the convenience of assembly and design flexibility, but also can be quickly used in the current package test equipment and various electronic equipment. The terminals 124 of the terminal block 120 have small-spacing, high-strength, high-conductivity, and low-impedance. Therefore, when transmitting signals or currents, the present invention can alleviate a temperature rising problem caused by high impedance, which improves the overall transmission efficiency and prolongs a service life. In addition to that, the various elastic designs of the terminals 124 can also be adapted to the current application of various current testing equipment. Furthermore, the test connector device 100 of the embodiment has a good supporting and elastic structure, which can well restore the component to be tested 1 disposed on the limiting plate 240, thereby improving the test yield and production efficiency.

Referring to FIGS. 11A to 11I together, the present invention further provides a manufacturing method of the terminal block 120, and the terminal block 120 of the first embodiment is described below as an example. The manufacturing method of the terminal block 120 includes the following steps. Step S1: providing at least one base portion 1221. Step S2: forming a conductive layer 134 on the at least one base portion 1221, and forming a patterned structure 136 on the conductive layer 134, wherein the patterned structure 136 forms a plurality of terminals 124 distributed in an array on the base portion 1221. Step S3: providing an adhesive layer 138 on the terminals 124, wherein the above steps S1 to S3 are repeated to form the terminal block 120 assembled on a substrate 122 and including the terminals 124 arranged in a plurality of rows. The first contact end 125 of each terminal 124 includes a first extension portion 126 and a first top portion 127 connected to the first extension portion 126. The second contact end 128 includes a second extension portion 129 and a second top portion 131 connected to the second extension portion 129. A fastening portion 133 connects the first contact end 125 and the second contact end 128, and the fastening portion 133 can be positioned in the substrate 122.

It should be noted here that a material of the conductive layer 134 is selected from a group consisting of beryllium copper alloy, phosphor bronze, nickel titanium alloy, or copper alloy. Materials of the base portions 1221 and 1222 are selected from a group of glass cloth materials with epoxy resin (FR4), polyimide, ceramic, or other suitable insulating materials. The patterned structure 136 is formed by chemical processes such as exposure, development, and etching to form a spacer pad 137, terminal groups (not labeled) at two sides of the spacer pad 137, and positioning pads (not labeled) at an edge of each terminal group. The spacer pad 137 and the positioning pads can effectively separate the terminal groups to avoid short-circuit due to contact between the terminals. The terminals 124 of the respective terminal groups are arranged face-to-face, that is, the first contact ends 125 and the first contact ends 128 of the respective terminal groups are bent to have a face-to-face arrangement. However, in the third embodiment shown in FIGS. 7 to 9, the terminals 224 of the terminal block 222 can also be arranged to face a same direction, and the configuration may vary as required or designed. A distance between any two adjacent terminals 124 in each terminal group is 0.4 to 0.8 mm, and a distance between the terminal groups is 1.8 to 2.2 mm. The terminals 124 of any two adjacent terminal groups face opposite directions, and a distance between any two adjacent terminals 124 in each row of the terminals is 0.2 to 0.9 mm, and a distance between any two adjacent terminal rows is 0.4 to 1 mm.

According to the requirements of the component to be tested 1, the present embodiment can perform a modular lamination manufacturing process, so that the base portions 1221, 1222, the conductive layer 134, and the adhesive layer 138 are repeatedly stacked to form a structure in which a plurality of terminals 124 and the substrate 122 are formed in an integral form. The terminals 124 have good mechanical and electrical properties, such as good conductivity, and prevent the first contact ends 125 and the second contact ends 128 from being damaged due to excessive bending when subjected to force. The terminals 124 have advantages such as high strength, low impedance, and greatly reduced pitches.

The above descriptions are only preferred embodiments of the present invention, and are not intended to limit the protection scope of the present invention. Other equivalent changes based on the present invention shall all fall within the protection scope of the present invention.

What is claimed is:

1. A test connector device for testing a component to be tested, the component to be tested comprising a plurality of conductive portions, the test connector device comprising:
   a base;
   a terminal block disposed on the base, the terminal block comprising a substrate and a plurality of terminal rows, the substrate and the plurality of terminal rows have an integral form, each of the plurality of terminal rows comprising multiple terminals, each of the terminals comprising a first contact end and a second contact end arranged corresponding to each other; and
   a limiting member where the component to be tested is positioned, the limiting member movably assembled to one side of the base, the limiting member comprising a positioning assembly and a plurality of rows of limiting slots, the first contact ends protruding out of the limiting slots, the positioning assembly movably positioned on the base, each of the first contact ends contacting one of the plurality of conductive portions.

2. The test connector device according to claim 1, wherein the positioning assembly comprises a plurality of hooks, a plurality of limit pins, and a plurality of first elastic pieces, each of the hook passes through an open groove of the base and is positioned in the open groove, each of the limit pins is inserted into a limit hole of the base, and each of the first elastic pieces is sleeved on one of the limit pins and accommodated in one of the limit holes to elastically restore the limiting member.

3. The test connector device according to claim 2, wherein when the first elastic pieces restore and push the limiting member, the first contact ends of each of the plurality of terminal rows are separated from the plurality of conductive portions of the component to be tested, and the limiting member is located at a first position; and when the component to be tested and the limiting member move toward the base, each of the plurality of conductive portions abuts one of the first contact ends, and the limiting member is located at a second position.

4. The test connector device according to claim 1, further comprising a guide member disposed on another side of the base, the guide member comprising a plurality of rows of guide through grooves disposed corresponding to the second contact ends, wherein the second contact ends are limited by and protrude from the plurality rows of guide through grooves.

5. The test connector device according to claim 4, wherein the guide member further comprises a plurality of elastic buckles, a plurality of guide pins, and a plurality of second elastic pieces, each of the elastic buckles is engaged with a guide groove of the base, each of the guide pins is arranged corresponding to a guide hole of the base, and each of the second elastic pieces is sleeved on one of the guide pins and accommodated in one of the guide holes to elastically restore the guide member.

6. The test connector device according to claim 5, further comprising a carrier plate supporting the base, the carrier plate comprising multiple conductive pads arranged in a plurality of rows and contacting the second contact ends respectively, wherein the guide member is disposed between the base and the carrier plate.

7. The test connector device according to claim 1, wherein the plurality of terminal rows form a plurality of terminal groups, the plurality of terminal groups are arranged at intervals, and a distance between any two adjacent terminals in each terminal group ranges from 0.4 millimeters (mm) to 0.8 mm, and a distance between the plurality of terminal groups ranges from 1.8 to 2.2 mm.

8. The test connector device according to claim 7, wherein a number of the plurality of terminal groups is 4, each of the plurality of terminal groups is arranged to form an array of 5×10, and in two adjacent terminal groups along the longitudinal direction, the terminals of one terminal group are provided in a face-to-face arrangement with respect to the terminals of the other terminal group.

9. The test connector device according to claim 1, wherein a distance between any two adjacent ones of the terminals in each of the plurality of terminal rows ranges from 0.2 mm to 0.9 mm, and a distance between any two adjacent ones of the plurality of terminal rows ranges from 0.4 mm to 1 mm.

10. The test connector device according to claim 1, wherein the first contact end of each of the terminals comprises a first extension portion and a first top portion connected to the first extension portion, and the second contact end of each of the terminals comprises a second extension portion and a second top portion connected to the second extension portion.

11. The test connector device according to claim 1, wherein the limiting member further comprises a limit groove on one side facing away from the base, the limit groove accommodates and positions the component to be tested, and a shape of the limit groove corresponds to a shape of the component to be tested.

* * * * *